United States Patent
Lin et al.

(10) Patent No.: US 10,283,372 B2
(45) Date of Patent: May 7, 2019

(54) INTERCONNECTS FORMED BY A METAL REPLACEMENT PROCESS

(71) Applicant: GLOBALFOUNDRIES Inc., Grand Cayman (KY)

(72) Inventors: Sean Xuan Lin, Watervliet, NY (US); Xunyuan Zhang, Troy, NY (US); Mark V. Raymond, Latham, NY (US); Errol Todd Ryan, Clifton Park, NY (US); Nicholas V. LiCausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/705,956

(22) Filed: Sep. 15, 2017

(65) Prior Publication Data

US 2019/0088500 A1    Mar. 21, 2019

(51) Int. Cl.
*H01L 27/10* (2006.01)
*H01L 21/3205* (2006.01)
*H01L 21/768* (2006.01)
*H01L 23/532* (2006.01)

(52) U.S. Cl.
CPC .... *H01L 21/32055* (2013.01); *H01L 21/7682* (2013.01); *H01L 23/53242* (2013.01); *H01L 23/53252* (2013.01); *H01L 21/76877* (2013.01); *H01L 2924/0002* (2013.01)

(58) Field of Classification Search
CPC ....... H01L 23/5226; H01L 2224/05647; H01L 23/528; H01L 21/76807; H01L 2221/1036; H01L 2224/05546; H01L 23/53261; H01L 27/14636

USPC ................................................. 257/211, 758
See application file for complete search history.

(56) References Cited

U.S. PATENT DOCUMENTS

| | | | |
|---|---|---|---|
| 5,550,405 A * | 8/1996 | Cheung | H01L 23/53228 257/642 |
| 6,100,194 A | 8/2000 | Chan et al. | |
| 6,291,082 B1 | 9/2001 | Lopatin | |
| 6,541,859 B1 | 4/2003 | Forbes et al. | |
| 7,229,924 B2 | 6/2007 | Farrar | |
| 9,564,362 B2 | 2/2017 | Baker-O'Neal et al. | |
| 2006/0251800 A1* | 11/2006 | Weidman | B82Y 30/00 427/99.5 |
| 2007/0108404 A1* | 5/2007 | Stewart | C11D 7/08 252/79.1 |

(Continued)

OTHER PUBLICATIONS

Mazumder et al., "Ag diffusion in Low-K material (SiOC and BCN) and its challenges using as an interconnection", Extended Abstracts of the 2006 International Conference on Solid State Devices and Materials, Yokohama, 2006, pp. 478-479.

(Continued)

*Primary Examiner* — Theresa T Doan
(74) *Attorney, Agent, or Firm* — Thompson Hine LLP; Anthony Canale

(57) ABSTRACT

Methods of forming interconnects. An interconnect opening is formed in a dielectric layer. A first conductor layer composed of a first metal is formed in the interconnect opening. A second conductor layer is formed inside the interconnect opening by displacing the first metal of the first conductor layer and replacing the first metal with a second metal different from the first metal.

20 Claims, 3 Drawing Sheets

(56) References Cited

U.S. PATENT DOCUMENTS

2012/0252181 A1* 10/2012 Watanabe ......... H01L 21/76802
438/381

OTHER PUBLICATIONS

Hauder et al., "Ag metallization with high electromigration resistance for ULSI", Solid-State Electronics 47 (2003) 1227-1231.
Wikipedia, "IAg" retrieved from the internet at https://en.wikipedia.org/w/index.php?title=IAg&oldid=673417636, last edited on Jul. 28, 2015.

* cited by examiner

INTERCONNECTS FORMED BY A METAL REPLACEMENT PROCESS

BACKGROUND

The present invention relates to integrated circuits and semiconductor device fabrication and, more specifically, to methods of forming interconnects.

An interconnect structure may be used to electrically connect device structures fabricated by front-end-of-line (FEOL) processing. A back-end-of-line (BEOL) portion of the interconnect structure may include metallization formed using a damascene process in which via openings and trenches etched in a dielectric layer are filled with metal to create features of a metallization level. Copper is a common material used in the metallization of the BEOL portion of the interconnect structure.

Improved methods of forming interconnects are needed.

SUMMARY

According to an embodiment of the invention, a method includes forming an interconnect opening in a dielectric layer, forming a first conductor layer composed of a first metal in the interconnect opening, and forming a second conductor layer inside the interconnect opening by displacing the first metal of the first conductor layer and replacing the first metal with a second metal different from the first metal.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
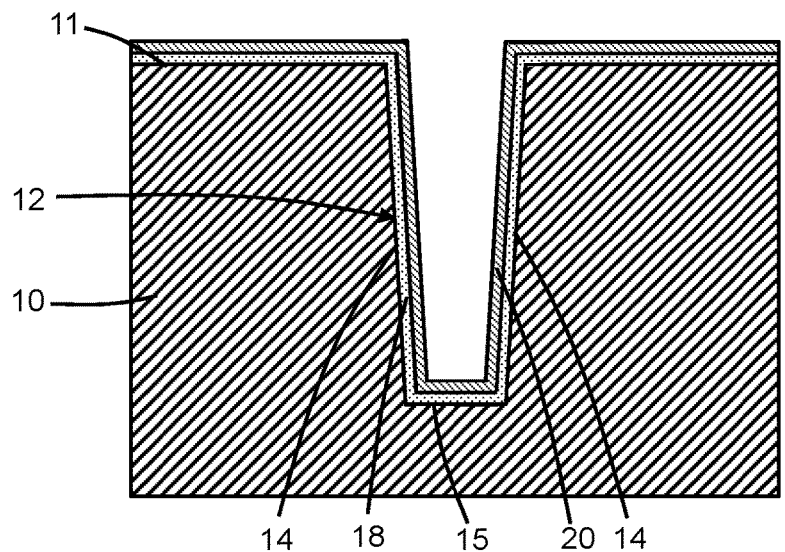
FIGS. 1-4 are cross-sectional views of a structure at successive fabrication stages of a processing method in accordance with embodiments of the invention.

With reference to FIG. 1 and in accordance with an embodiment of the invention, a dielectric layer 10 may be formed by middle-of-line (MOL) processing or by back-end-of-line (BEOL) for use in forming a metallization level of an interconnect structure. The dielectric layer 10 may be composed of an electrical insulator, such as silicon dioxide ($SiO_2$) or another suitable dielectric material, such as a low-k dielectric material or an ultra-low-k (ULK) dielectric material having a dielectric constant that is less than the dielectric constant of silicon dioxide.

Interconnect openings, including an interconnect opening 12, may be formed by photolithography and etching at selected locations distributed across the surface area of dielectric layer 10. Specifically, a photoresist layer may be applied, exposed to a pattern of radiation projected through a photomask, and developed to form a corresponding pattern of openings situated at the intended location for the interconnect openings, including the interconnect opening 12. The patterned photoresist layer is used as an etch mask for a dry etching process, such as a reactive-ion etching (RIE), that removes portions of the dielectric layer 10 to form the interconnect opening 12. The etching process may be conducted in a single etching step or multiple etching steps with different etch chemistries and with the use of additional hard mask layers.

The interconnect opening 12 may be a contact opening, a via opening, or a trench defined in the dielectric layer 10 and may have an aspect ratio of height-to-width that is characteristic of a contact opening, a via opening, or a trench. In an embodiment, the interconnect opening 12 may be a dual-damascene opening that includes a trench and one or more via openings. The interconnect opening 12 has a bottom 15 and one or more sidewalls 14 that penetrate from a top surface 11 of the dielectric layer 10 to a surface at the bottom 15 of the interconnect opening 12. The sidewalls 14 are bounded by the dielectric material of the dielectric layer 10, and the bottom 15 may also be bounded by the dielectric material of the dielectric layer 10. Alternatively, the interconnect opening 12 may land at its bottom 15 on an underlying conductive feature (not shown) as part of a process to establish a vertical interconnection.

A barrier/liner layer 18 of a given thickness and a seed layer 20 of a given thickness are arranged on the sidewalls 14 and at the bottom 15 of the interconnect opening 12. The barrier/liner layer 18 may be comprised of cobalt (Co), titanium (Ti), titanium nitride (TiN), tantalum (Ta), tantalum nitride (TaN), ruthenium (Ru), or a multilayer combination of these materials (e.g., a TaN/Ta, or TaN/Co bilayer) deposited by physical vapor deposition (PVD) with, for example, a sputter-assisted process, chemical vapor deposition (CVD) or atomic layer deposition (ALD). The barrier/liner layer 18 conforms to the shape of the interconnect opening 12 such that the dielectric layer 10 bordering the sidewalls 14 of the interconnect opening 12 and the bottom surface 15 of the interconnect opening 12 are completely covered by a uniform given thickness. The seed layer 20, which is formed after the barrier/liner layer 18, forms on the exposed surfaces of the barrier/liner layer 18. The seed layer 20 may be a continuous layer composed of a conductor, such as copper (Cu), deposited by physical vapor deposition (PVD). The materials of the barrier/liner layer 18 and the seed layer 20 also form in the field area on the top surface of the dielectric layer 10.

Figure 2:
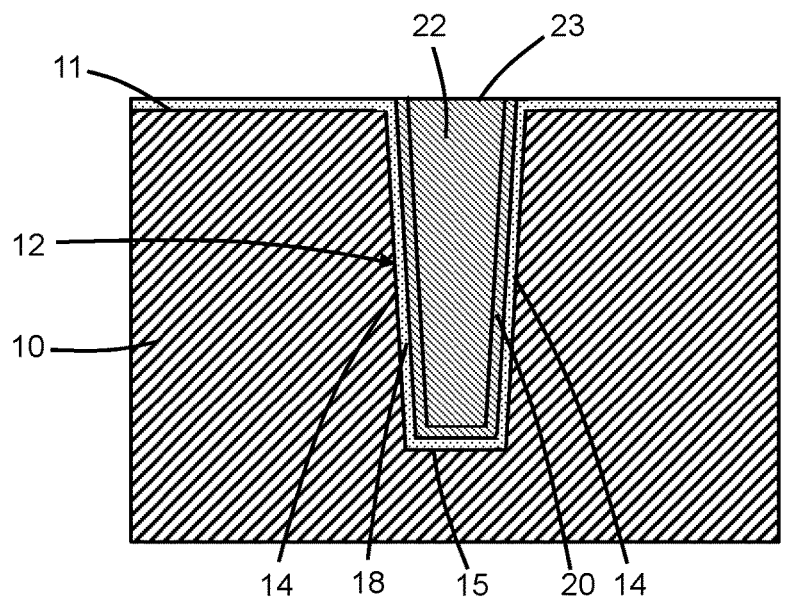

With reference to FIG. 2 in which like reference numerals refer to like features in FIG. 1 and at a subsequent fabrication stage, a conductor layer 22 is formed inside the interconnect opening 12 in contact with the seed layer 20. The conductor layer 22 may be deposited by electroless or electrolytic deposition, and the seed layer 20 promotes formation of the material of the conductor layer 22. Alternatively, the conductor layer 22 may be formed by a physical vapor deposition (PVD) process, followed by a reflow process. The conductor layer 22 may be composed of the same metal (for example, copper) as the seed layer 20. The conductor layer 22 may be composed of copper (Cu) or, alternatively, may be composed of cobalt (Co). The material of the conductor layer 22 also forms in the field area on the top surface 11 of the dielectric layer 10.

The materials of the seed layer 20 and the conductor layer 22 may be removed from the field area on the top surface 11 of the dielectric layer 10 with a chemical mechanical polishing (CMP) process. Material removal during the CMP process combines abrasion and an etching effect that polishes the targeted material and may be conducted with a commercial tool using polishing pads and slurries selected to polish the targeted material(s). The conductor layer 22 and seed layer 20 inside the interconnect opening 12 are planarized by the CMP process to provide a top surface 23 that is coplanar with the barrier/liner layer 18 on the top surface 11 of the dielectric layer 10.

Figure 3:
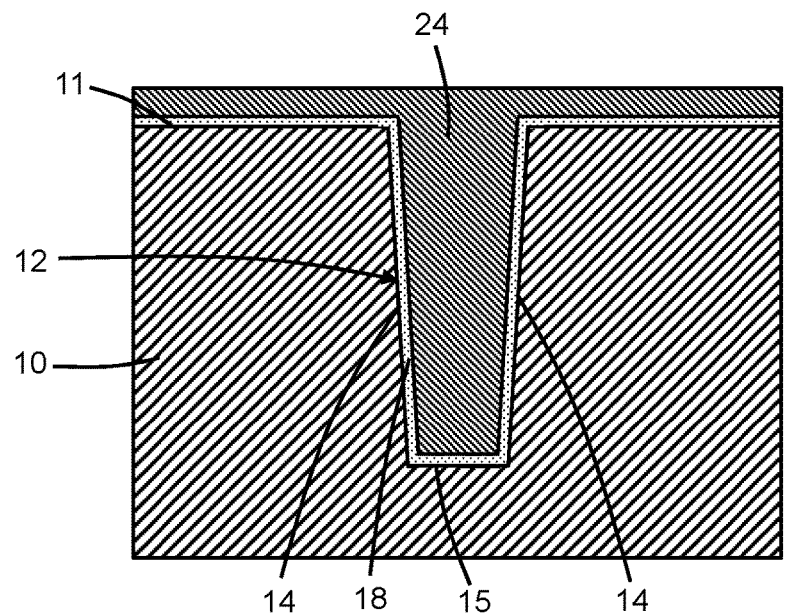

With reference to FIG. 3 in which like reference numerals refer to like features in FIG. 2 and at a subsequent fabrication stage, a conductor layer 24 is formed inside the interconnect opening 12 by displacing atoms of the metal(s) constituting the conductor layer 22 and seed layer 20 and replacing these displaced atoms with atoms of a different conductor. The replacement reaction is generated by an immersion process, which proceeds spontaneously due to kinetics of the associated oxidation-reduction reaction. An immersion process is distinguishable from electroless or electrolytic processes that do not rely on the mechanism of metal displacement or replacement. In an immersion process, atoms of a metal (for example, the metal in the seed layer 20 and conductor layer 22) may be displaced and replaced by atoms of a metal (for example, the metal in conductor layer 24) having a higher standard reduction potential.

In an embodiment, the conductor layer 24 may be composed of silver (Ag) formed by an immersion process in which silver atoms in solution displace and replace copper atoms in the conductor layer 22 and seed layer 20. The electrochemical properties of copper and silver, and the spontaneous oxidation-reduction reaction that occurs during an immersion process involving copper and silver, is shown in Table 1.

TABLE 1

| Metal | Reaction | Standard Reduction Potential (V) | Immersion Reaction | Immersion Potential (V) |
|---|---|---|---|---|
| Copper | $Cu\,(s) \leftrightarrow Cu^{2+} + 2e^-$ | 0.340 | $2Ag^+ + Cu \rightarrow$ | 1.259 |
| Silver | $Ag^+ + e^- \leftrightarrow Ag\,(s)$ | 0.7996 | $2Ag + Cu^{2+}$ | |

The conductor layer 22 and seed layer 20 are exposed to a solution containing a chemistry (e.g., silver ion chemistry such as a bath or solution containing, for example, silver nitrate) that provides silver ions to replace copper in the immersion reaction. During the immersion reaction, cracks or fissures may form in the conductor layer 24 as it replaces the conductor layer 22 and seed layer 20 to allow pathways for continuous displacement and replacement until the metal of the conductor layer 22 and seed layer 20 is consumed. The conductor layer 24 may completely displace and replace the conductor layer 22 and seed layer 20 such that the interconnect opening 12 is completely filled by the conductor layer 24. The conductor layer 24 may overfill the interconnect opening 12. In alternative embodiments, the conductor layer 22 and seed layer 20 may be replaced by gold as part of a gold immersion process in that gold also has a higher standard reduction potential than copper and will spontaneously react with copper.

Figure 4:
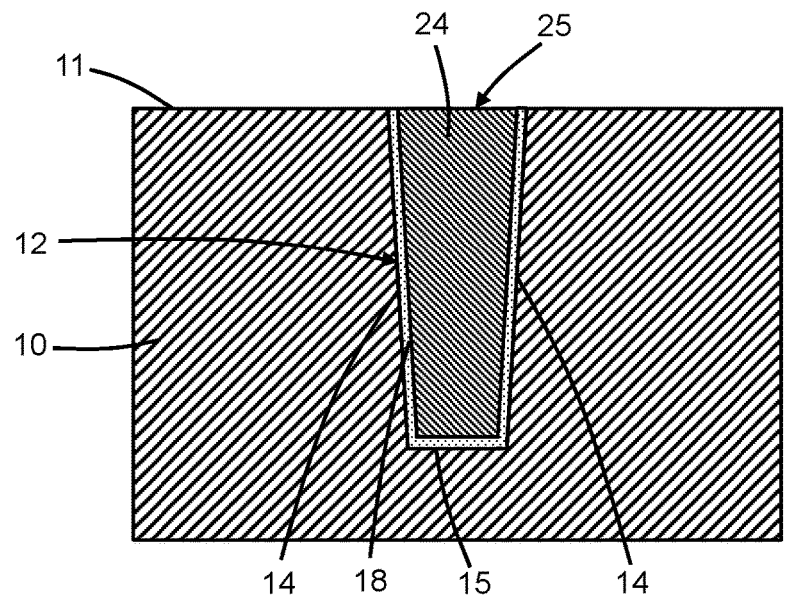

With reference to FIG. 4 in which like reference numerals refer to like features in FIG. 3 and at a subsequent fabrication stage, the conductor layer 24 may be planarized with a CMP process to produce a conductive feature 25 disposed inside the interconnect opening 12. The barrier/liner layer 18 may be removed from the field area on the top surface 11 of the dielectric layer 10 with a CMP process, which may be the same CMP process planarizing the conductor layer 24 or a different CMP process. If the interconnect opening 12 is a trench, the conductive feature 25 may be a wire. If the interconnect opening 12 is a contact opening, the conductive feature may be a contact. If the interconnect opening 12 is a via opening, the conductive feature may be a via plug.

The conductor layer 24 may be annealed either before or after planarization using the CMP process. In an embodiment, the anneal may be a thermal anneal that is conducted at a temperature ranging from 100° C. to 500° C. in an atmosphere of hydrogen, nitrogen or mixture of these two gases.

The conductive feature 25 composed of silver has a lower electrical resistance than a comparable feature formed from copper due to the higher electrical conductivity of silver. Silver and copper are miscible material and do not form a high-resistance intermetallic phase when dissolving into each other. In addition, the conductive feature 25 formed from silver may have better reliability than a comparable conductive feature formed from copper. Silver tends to diffuse less into low-k dielectric materials than copper, which may permit the thickness of the barrier/liner layer 18 to be reduced and thereby provide a reduction in RC delay.

Figure 5:
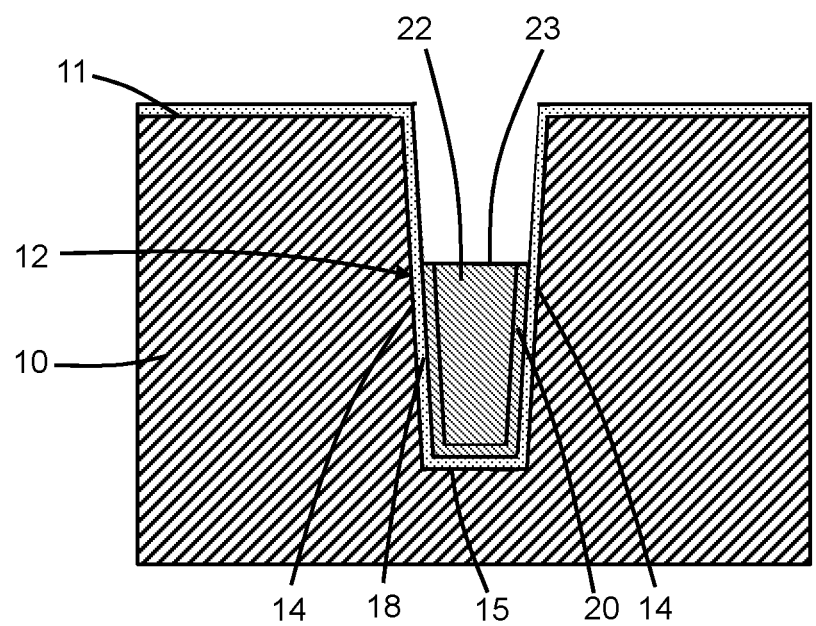
FIG. 5 is a cross-sectional view of a structure at a fabrication stage subsequent to FIG. 2 of a processing method in accordance with alternative embodiments of the invention.

With reference to FIG. 5 in which like reference numerals refer to like features in FIG. 2 and at a subsequent fabrication stage in accordance with alternative embodiments, the conductor layer 22 and seed layer 20 may be recessed inside the interconnect opening 12 before performing the process that replaces the conductor layer 22 and seed layer 20 with the conductor layer 24. A wet chemical etching process may be used to recess the conductor layer 22 and seed layer 20 relative to the top surface 11 of the dielectric layer 10. An example of a wet etch chemistry includes a diluted acid, a mixture of peroxide with acid, or a base chemical such as HCl or $NH_4OH$. After the wet recess, the remaining layer of conductor layer 22 and seed layer 20 are displaced by conductor layer 24. After conductor layer 22 and seed layer 20 are consumed, the conductor layer 24 will continue to grow and completely fill the interconnect opening 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming an interconnect opening in a dielectric layer;
    forming a first conductor layer composed of a first metal in the interconnect opening; and
    forming a second conductor layer inside the interconnect opening by an oxidation-reduction reaction during an immersion process that concurrently displaces the first metal of the first conductor layer and replaces the first metal with a second metal different from the first metal.
2. The method of claim 1 wherein the first metal is copper, and the second metal is silver.
3. The method of claim 1 wherein the dielectric layer has a top surface, and further comprising:
    recessing the first conductor layer inside the interconnect opening.
4. The method of claim 3 wherein the first conductor layer is recessed before forming the second conductor layer.
5. The method of claim 1 further comprising:
    annealing the second conductor layer.
6. The method of claim 1 wherein atoms of the second metal in a solution displace and replace atoms of the second metal during the immersion process.
7. The method of claim 1 wherein the first metal has a first standard reduction potential, and the second metal has a second standard reduction potential that is greater than the first standard reduction potential.
8. The method of claim 1 wherein the second conductor layer completely replaces the first conductor layer.
9. The method of claim 1 wherein the first metal has a first standard reduction potential, and the second metal has a second standard reduction potential that is greater than the first standard reduction potential.
10. The method of claim 1 further comprising:
    before forming the first conductor layer, depositing a barrier/liner layer on surfaces of the dielectric layer bordering the interconnect opening,
    wherein the barrier/liner layer is not replaced by the second metal.
11. The method of claim 1 further comprising:
    planarizing the first conductor layer,
    wherein the first conductor layer is planarized before forming the second conductor layer.
12. The method of claim 11 further comprising:
    planarizing the second conductor layer.
13. The method of claim 12 further comprising:
    before planarizing the second conductor layer, annealing the second conductor layer.
14. The method of claim 1 wherein the interconnect opening is a trench, and the second conductor layer is a wire.
15. The method of claim 1 wherein the interconnect opening is a contact opening, and the second conductor layer is a contact.
16. The method of claim 1 wherein the first metal is cobalt, and the second metal is gold.
17. The method of claim 1 wherein the interconnect opening is a via opening, and the second conductor layer is a via plug.
18. The method of claim 1 wherein the interconnect opening is a dual-damascene opening.
19. The method of claim 1 wherein the first metal has a first electrical conductivity, and the second metal has a second electrical conductivity that is greater than the first electrical conductivity.
20. The method of claim 19 wherein the first metal is cobalt, and the second metal is silver or gold.

* * * * *